United States Patent [19]
Higashiguchi

[11] Patent Number: 5,883,432
[45] Date of Patent: *Mar. 16, 1999

[54] CONNECTION STRUCTURE BETWEEN ELECTRODE PAD ON SEMICONDUCTOR DEVICE AND PRINTED PATTERN ON PRINTED CIRCUIT BOARD

[75] Inventor: Masahiro Higashiguchi, Kobe, Japan

[73] Assignee: Ricoh Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 758,555

[22] Filed: Nov. 29, 1996

[51] Int. Cl.⁶ ...................................................... H01L 23/34
[52] U.S. Cl. ........................... 257/727; 257/780; 257/781; 257/778
[58] Field of Search ..................................... 257/782, 783, 257/777, 780, 781, 726, 727, 787, 778

[56] References Cited

U.S. PATENT DOCUMENTS

| 5,311,402 | 5/1994 | Kobuyashi et al. | 257/779 |
| 5,436,503 | 7/1995 | Kunitomo et al. | 257/781 |

FOREIGN PATENT DOCUMENTS

| 60-262430 | 12/1985 | Japan | H01L 21/56 |
| 3-245558 | 11/1991 | Japan | H01L 23/29 |
| 3-255641 | 11/1991 | Japan | H01L 21/60 |
| 3-296233 | 12/1991 | Japan | H01L 21/60 |
| WO89/02653 | 3/1989 | WIPO | 257/780 |

*Primary Examiner*—Mahshid Saadat
*Assistant Examiner*—S. V. Clark
*Attorney, Agent, or Firm*—Cooper & Dunham LLP

[57] ABSTRACT

A connection structure for producing both an electrical and a mechanical connection between an electrode pad on a semiconductor device and a printed circuit pattern on a printed circuit board includes a metal bump or a plating layer formed on the printed circuit pattern on the printed circuit board and/or on the electrode pad on the semiconductor device. The semiconductor device is connected to the printed circuit board using cold welding, compression bonding, or a combination of both in conjunction with sandwich materials. The semiconductor device can be separated from the printed circuit board without destroying the semiconductor device or the printed circuit board by releasing the pressure applied to the sandwich materials. Therefore, the semiconductor device can be removed from the printed circuit board to make necessary repairs and/or exchange parts, and then reconnected to the printed circuit board.

15 Claims, 5 Drawing Sheets

FIG. IA
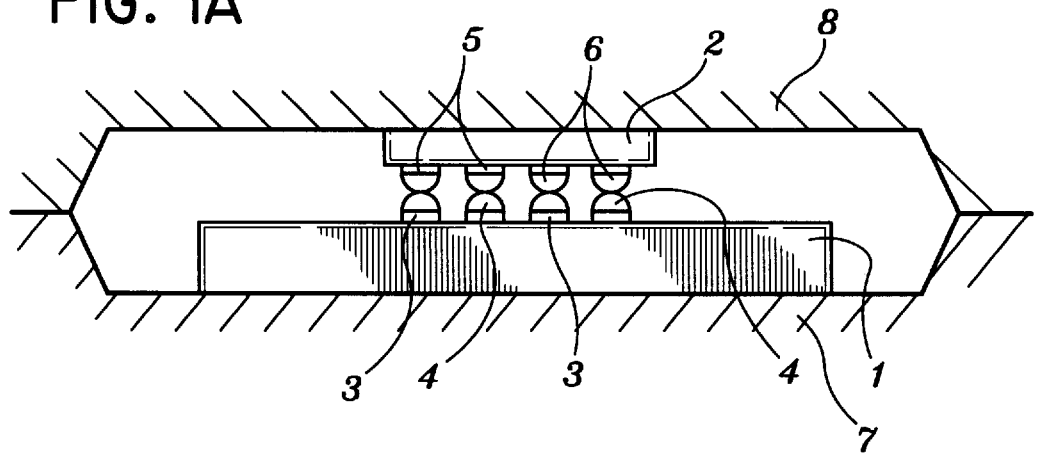
FIG. IB
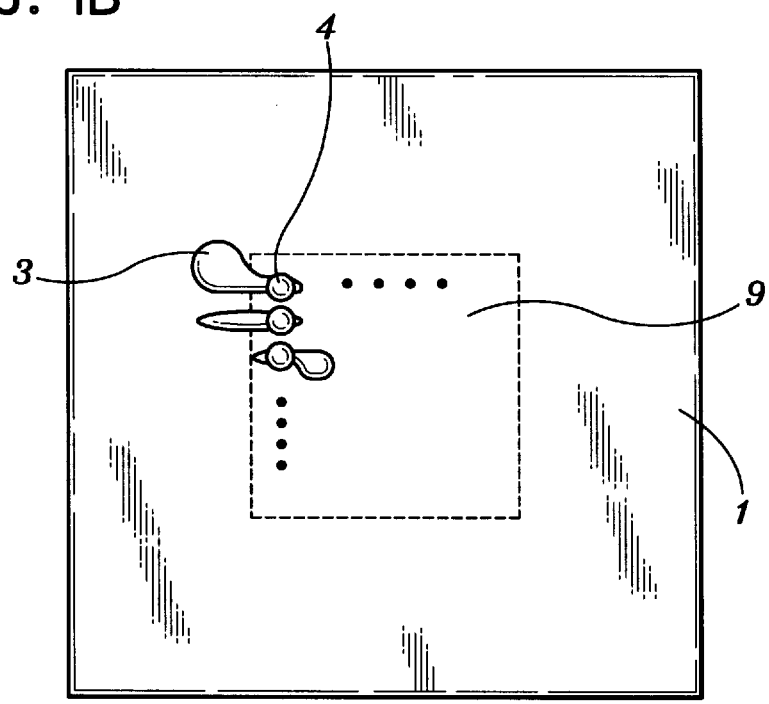
FIG. IC
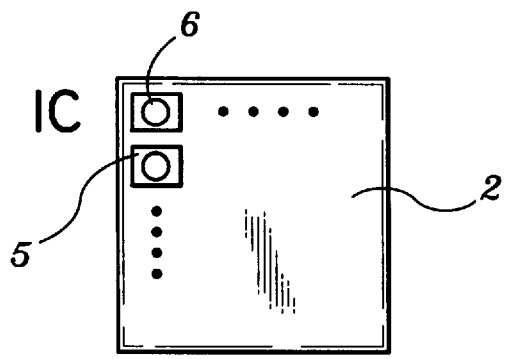

CONNECTION STRUCTURE BETWEEN ELECTRODE PAD ON SEMICONDUCTOR DEVICE AND PRINTED PATTERN ON PRINTED CIRCUIT BOARD

BACKGROUND OF THE INVENTION

1. Field of the Invention

The present invention relates generally to improvements in a connection structure between an electrode pad on a semiconductor device and a printed circuit pattern on a printed circuit board. More specifically, the present invention relates to improvements in a connection structure between an electrode pad and a printed circuit pattern such that repairs can easily be made to the connection structure without damaging the electrode pads or the printed circuit pattern.

2. Discussion of the Background

Chip scale type packages (CSPs) are known in the art of semiconductor device (IC chip) packages. In a chip scale type package, a rear surface of a semiconductor device is covered with a thin insulation layer except at portions serving as electrode pads. Generally, one side of an electrode pad is exposed while the other side is connected with a semiconductor circuit of the semiconductor device.

FIG. 13 shows a mounted body consisting of a semiconductor device mounted on a printed circuit board, as shown in Japanese Laid Open Patent No. 60-262430. This is an example of a mounted body of a chip scale type package. In FIG. 13, an electrode pad 5 on a semiconductor device 2 is arranged on a printed circuit pattern 3, and the printed circuit pattern 3 is electrically connected to the electrode pad 5 by way of a metal bump 29. The connection is mechanically fixed by resin 30 that is set with heat or light.

One drawback to using such a connection structure is the difficulty in repairing the mounted body once the electrode pad 5, printed circuit pattern 3, and metal bump 29 are mechanically fixed by the resin 30. That is, the mounted body is often destroyed at the electrode pad 5 and the printed circuit pattern 3 when the semiconductor device 2 is separated from the printed circuit board 1.

Similar difficulties arise when other methods are used for mounting a semiconductor device onto printed circuit patterns formed on a printed circuit board in a chip scale type package, such as in a reflow soldering method, as shown in Japanese Laid Open Patent No. 3-245558, for example. In this method, it is impossible to remove the semiconductor device from the printed circuit board without destroying the connecting portions between the printed circuit pattern on the printed circuit board and the electrode pad on the semiconductor device. As a result, repairs cannot be made to such a connection structure.

Further, similar difficulties arise when wire bonding methods, as shown in Japanese Laid Open Patent No. 3-296233, and tape automated bonding methods, as shown in Japanese Laid Open Patent No. 3-255641, are used. In these methods, it is impossible to remove the semiconductor device from the printed circuit board without destroying the connecting portions between the printed circuit pattern on the printed circuit board and the electrode pad on the semiconductor device. Therefore, repair of these types of connection structures cannot be accomplished.

SUMMARY OF THE INVENTION

Accordingly, an object of the present invention is to provide a novel connection structure between an electrode pad on a semiconductor device and a printed circuit pattern on a printed circuit board in a chip scale type package in which the semiconductor device can be separated from the printed circuit board without destroying the electrode pad or the printed circuit pattern.

BRIEF DESCRIPTION OF THE DRAWINGS

FIG. 1A shows a side view of a first embodiment of the present invention;

FIG. 1B shows a top view of a printed circuit board according to the embodiment of FIG. 1A;

FIG. 1C shows a rear view of a semiconductor device according to the embodiment of FIG. 1A;

DESCRIPTION OF PREFERRED EMBODIMENTS

Figure 2:
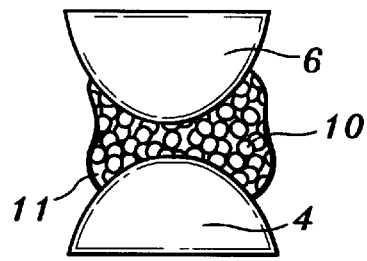
FIG. 2 shows metal bumps connected with electrically conductive adhesive.

The objects, features, and advantages of the present invention can be understood from the following detailed description of preferred embodiments of the present invention when considered in conjunction with the accompanying drawings, wherein like reference numerals refer to the same or similar elements.

In the various embodiments of the present invention, connection structures between an electrode pad on a semiconductor device and a printed circuit pattern on a printed circuit board are described.

FIGS. 1A–1C depict a connection structure according to a first embodiment of the present invention. FIG. 1A shows a side view of the first embodiment, FIG. 1B shows a top view of the printed circuit board 1 of FIG. 1A, and FIG. 1C shows a rear view of the semiconductor device 2 of FIG. 1A.

According to the first embodiment of the present invention, respective metal bumps are formed on a printed circuit pattern 3 and on an electrode pad 5. A mounted body consisting of the semiconductor device 2 mounted on the printed circuit board 1 is fixed by casings 7,8. The connection between the electrode pad 5 and the printed circuit pattern 3 is produced by cold welding (pressing) the respective metal bumps 4,6 on the printed circuit pattern 3 and the electrode pad 5 using the casings 7,8. The mounted body includes a connecting portion between the metal bump 4 formed on the printed circuit pattern 3 on the printed circuit board 1 and the metal bump 6 formed on the electrode pad 5 on the semiconductor device 2.

According to the present invention, cold welding (pressing) is accomplished by applying mechanical pressure to the top and bottom of the mounted body of the semiconductor device and the printed circuit board until an electrical connection is made between the respective metal bumps on the electrode pad of the semiconductor device and the printed circuit pattern of the printed circuit board.

In FIGS. 1A–1C, although metal bumps are formed both on the printed circuit patterns 3 (metal bumps 4) and on the electrode pads 5 (metal bumps 6), only one metal bump may be formed on each of the printed circuit patterns 3 and the electrode pads 5. Nevertheless, even if only one metal bump is formed on each of the printed circuit patterns 3 and the electrode pads 5, a connection made from such a structure is effective. Metal bumps 4,6 consist of, for example, gold or solder.

Metal bumps 6 are connected to metal bumps 4 by cold welding (pressing) the metal bumps 4,6 using the casings 7,8. The casings 7,8 are part of an electrical device that includes the semiconductor device 2. In cold welding the bumps 4,6 together, it does not matter whether a space that is formed between the casings 7,8 is formed intentionally or not. In other words, the electrical device may include casings 7,8 that are constructed to intentionally provide a separation therebetween for accommodating the mounted body.

FIG. 1B shows an area 9 surrounded by dotted lines indicating a position at which the semiconductor device 2 is arranged. Instead of using the casings 7,8, other materials may be used as sandwich materials for pressing the semiconductor device 2 onto the printed circuit board 1 to form the mounted body.

In addition to cold welding using the casings 7,8 as sandwich materials, compression bonding (pressure attachment) can also be used to form a connection between the electrode pad 5 and the printed circuit pattern 3. Compression bonding (pressure attachment) is accomplished by using an electrically conductive adhesive between two facing metals portions and applying continuous mechanical pressure to the top and bottom of the mounting body of the semiconductor device 2 and the printed circuit board 1. An example of two facing metal portions connected using electrically conductive adhesive is shown in FIG. 2. (Note that the two facing metal portions are not necessarily the two metal bumps 4,6 shown in FIG. 2, but instead can be the printed circuit pattern 3 and the metal bump 6 or, alternatively, the metal bump 4 and the electrode pad 5.)

The electrically conductive adhesive used in compression bonding, according to the present invention, can be electrically conductive paste that contains particles of silver (Ag), platinum (Pt), gold (Au), copper (Cu), aluminum (Al), nickel (Ni), or solder, for example. In FIG. 2, reference numeral 10 represents particles of silver, platinum, or gold, for example, and reference numeral 11 represents a resin such as epoxy, for example, that surrounds the particles 10.

If both cold welding and compression bonding are used together, a certain and reliable connection is expected.

Although compression bonding is generally described as given above, heat and pressure may be simultaneously applied in conjunction with use of the electrically conductive adhesive. This manner of compression bonding is known as thermocompression bonding. Thermocompression bonding may be used to set the electrically conductive adhesive and thus provide a reliable connection between the two facing metal portions.

Metal bump 4,6 can be formed using a bump bonder, which is a tool for forming bumps, and it can also be formed by plating methods such as electroplating, for example.

In forming a metal bump 4,6 by plating, a first metal layer such as nickel or Nichrome, for example, is deposited onto a printed circuit pattern 3 on a printed circuit board 1 or onto an electrode pad 5 on a semiconductor device 2. After forming the first metal layer, the printed circuit board 1 (or the semiconductor device 2) is immersed in a plating solution. Metal from the plating solution is precipitated onto the printed circuit pattern 3 (or onto the electrode pad 5) by conventional electrochemical techniques to form a plated metal layer. More specifically, electricity is used in precipitating metal from the plating solution onto electrically conductive regions of the printed circuit pattern 3. The first metal layer is used to promote adhesion between the plated metal layer and the printed circuit pattern 3 (or the electrode pad 5) and also to prevent oxidation of the printed circuit pattern 3 (or the electrode pad 5).

An insulation layer (not shown in the FIGS.) is present on a rear surface of the semiconductor device 2 except at regions forming the electrode pads 5. The insulation layer serves as a protection layer for the semiconductor device 2.

Figure 3A:
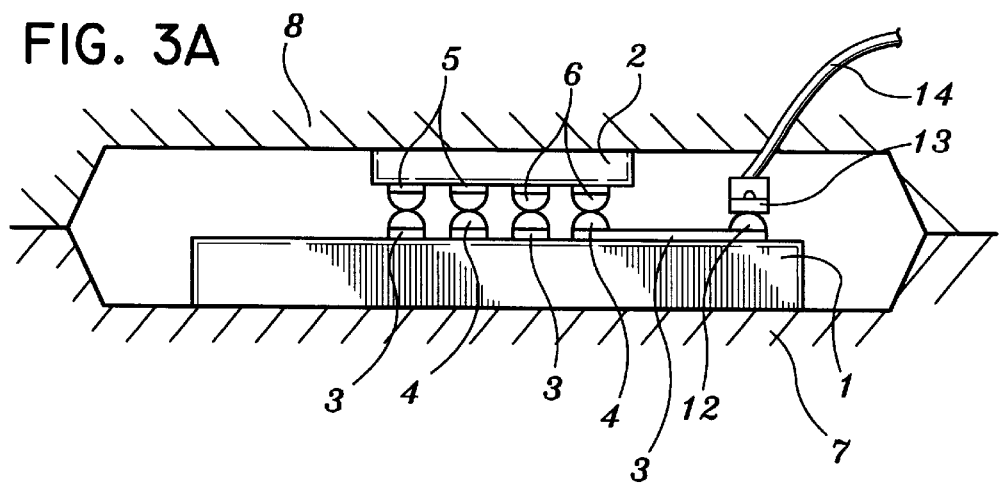
FIG. 3A shows a side view of a connection structure between a printed circuit board, a semiconductor device, and an external device according to an embodiment of the present invention.
Figure 3B:
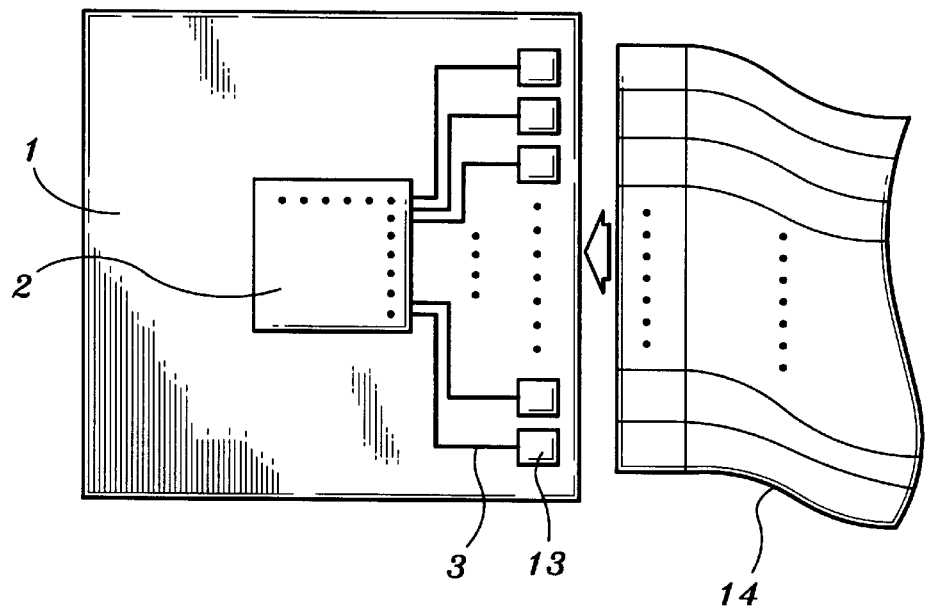
FIG. 3B shows a top view of the structure of FIG. 3A.

An example of a connection between the mounted body and an external device is shown in FIGS. 3A–3B, which respectively show a side view and a top view thereof. In FIGS. 3A–3B, reference numeral 12 represents a metal bump, reference numeral 13 represents an electrode, and reference numeral 14 represents a connector.

Figure 4:
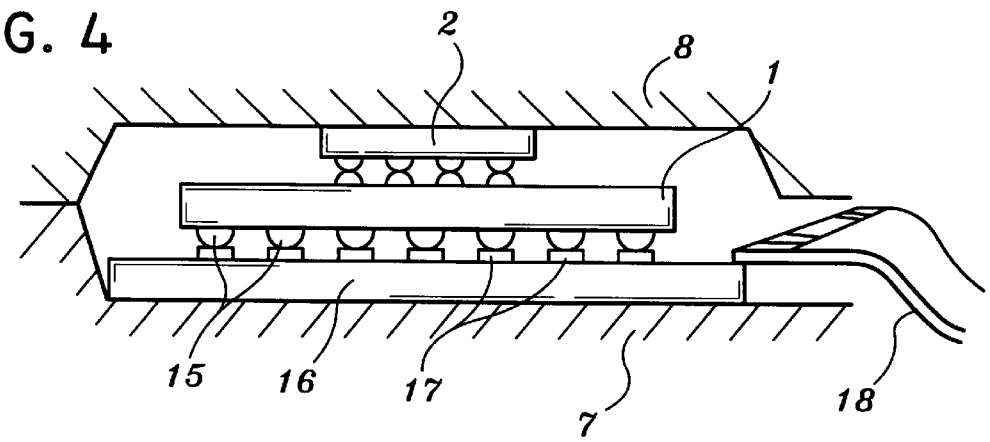
FIG. 4 shows a side view of a connection structure between a printed circuit board, a semiconductor device, and an external device according to another embodiment of the present invention.

Another example of a connection between the mounted body and an external device is shown in FIG. 4. In FIG. 4, reference numeral 15 represents a metal bump, and the printed circuit board 1 is connected with another printed circuit board 16 by metal bumps 15. A mounted body consisting of a semiconductor device 2, a printed circuit board 1, and a printed circuit board 16 is connected to an external device by a connector 18. Reference numeral 17 represents a printed circuit pattern formed on the printed circuit board 16. The printed circuit pattern 3 of the printed circuit board 1, which is shown in FIG. 1, is not shown in FIG. 4.

In the above-described first embodiment, the metal bumps 4,6 formed on the printed circuit pattern 3 and the electrode pad 5, respectively, are connected when the electrode pad 5 on the semiconductor device 2 and the printed circuit pattern 3 on the printed circuit board 1 are connected. However, an object of the present invention is accomplished if either the metal bump 4 is formed on the printed circuit pattern 3 or the metal bump 6 is formed on the electrode pad 5. When the metal bump 4 and the metal bump 6, the metal bump 4 and the electrode pad 5, or the metal bump 6 and the printed circuit pattern 3 are connected together by cold welding or by compression bonding or by a combination of both methods, separating the semiconductor device 2 from the printed circuit board 1 without destroying any part of them can be accomplished as described below. Also, reconnection of the semiconductor device and the printed circuit board can easily be accomplished.

Separating the semiconductor device 2 from the printed circuit board 1 can be accomplished simply by removing the materials sandwiching the mounted body consisting of the semiconductor device 2 and the printed circuit board 1. More particularly, for the embodiment shown in FIG. 1, separation is accomplished simply by releasing the casings 7,8 sandwiching the mounted body.

The melting temperature of the metal bumps 4,6 is generally high (typically about 230° C. for solder bumps, for example), and therefore melting of the metal bumps as a way to separate the semiconductor device 2 from the printed circuit board 1 is risky and may cause damage to other structures in the electrical device.

Separating a connection made by thermocompression bonding can be accomplished by melting an electrically conductive adhesive, such as an electrically conductive paste, located between the printed circuit pattern 3 and the electrode pad 5. Melting is necessary because the electrically conductive adhesive is set with heat in thermocompression bonding. Electrically conductive paste, such as shown in FIG. 2, can be rendered molten at temperatures ranging from about 120° C. to 150° C. Accordingly, repairing of connected parts can be accomplished by melting the electrically conductive paste connecting the parts, performing the repairs, and reapplying electrically conductive paste to reconnect the parts.

Although the temperature range of about 120° C. to 150° C. is adequate for melting typical electrically conductive pastes, this temperature range is not high enough to melt the metal bumps 4,6 and, in general, will not damage other parts of the electrical device.

For the casings 7,8 arranged above and below a mounted body of a printed circuit board 1 and a semiconductor device 2, as in FIG. 3A, the top of a semiconductor device 2 and the bottom of a printed circuit board 1 are pressed together, as in cold welding or compression bonding, by the insides of the casings 7,8. Accordingly, a cold welded state or a compression bonded state using metal bumps 4,6 can be maintained. In addition, removing the semiconductor device 2 from the printed circuit board 1 is accomplished simply by releasing the casings 7,8.

Although the casings 7,8 are used in the above-mentioned embodiment as a means for achieving cold welding (or compression bonding, or a combination of both), this is only one example of a sandwich material. Cold welding (or compression bonding, or a combination of both) can also be achieved by using other parts of the electrical device, which can be made to oppose the mounted body of the semiconductor device 2 and the printed circuit board 1.

Figure 5:
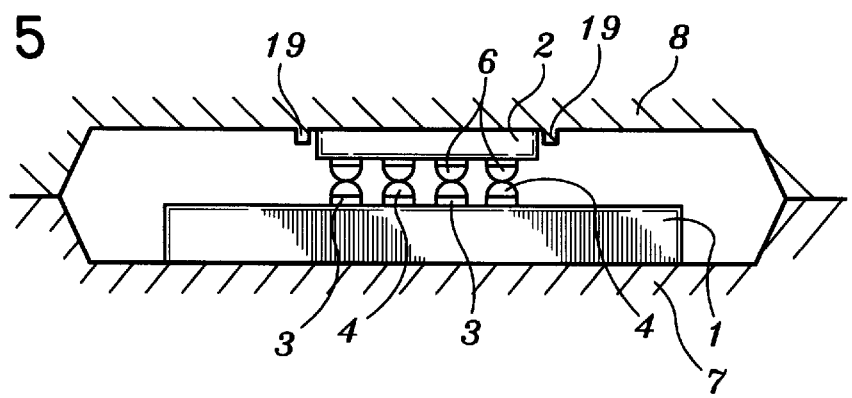
FIG. 5 is a side view showing an example of guide parts according to the first embodiment of the present invention.
Figure 6:
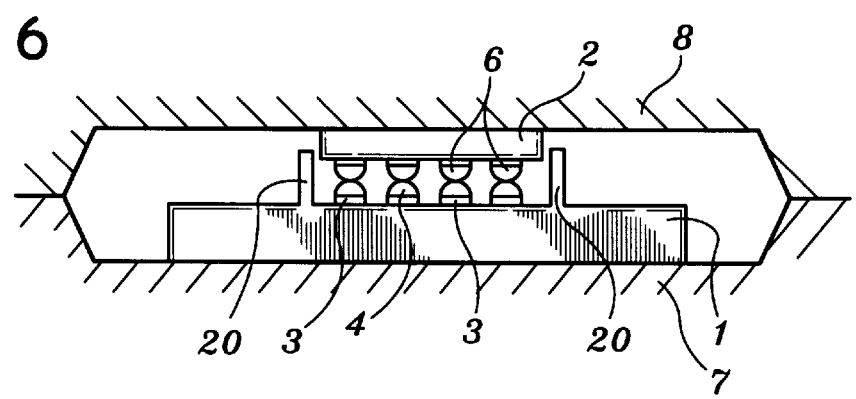
FIG. 6 is a side view showing another example of guide parts according to the first embodiment of the present invention.
Figure 13:
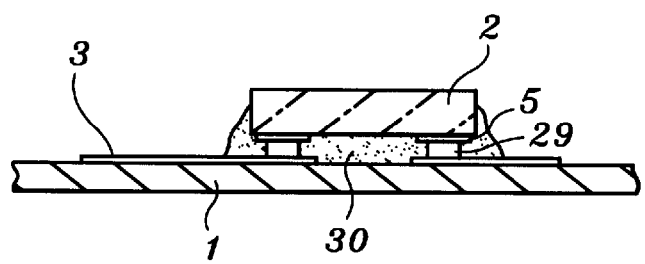
FIG. 13 is a side view of a conventional connection structure between a printed circuit board and a semiconductor device.
Figure 7:
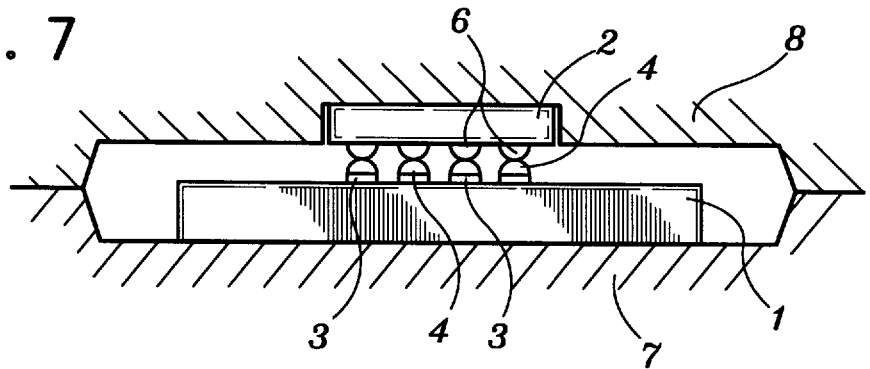
FIG. 7 is a side view showing a recess according the first embodiment of the present invention.

Positioning the semiconductor device 2 is easier if a guide part 19 is present to indicate where the semiconductor device 2 is to be arranged on the sandwich material 8, as shown in FIG. 5. Alternately, a guide part 20 can be used to indicate where the semiconductor device 2 is to be arranged on the printed circuit board 1, as shown in FIG. 6. FIG. 7 shows a recess on the surface of the sandwich material 8, which makes it easier to determine the proper position of the semiconductor device 2 relative to the printed circuit board 1.

In FIGS. 5–7, an electrode pad formed on a semiconductor device 2 (as denoted by reference numeral 5 in FIG. 1) is omitted from the illustrations.

Figure 8:
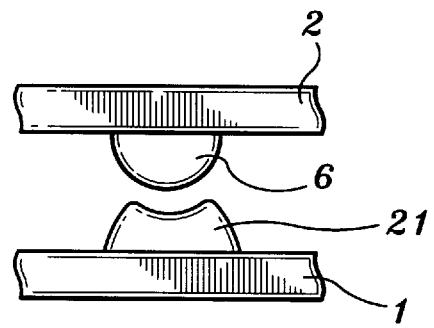
FIG. 8 shows a side view of a metal bump with a concave configuration on one of a printed circuit board and a semiconductor device.

When either of the metal bumps 4,6 of FIG. 1A has a concave configuration, as shown by reference numeral 21 in FIG. 8, the proper position of the semiconductor device 2 on the printed circuit board 1 is easier to determine. Forming the concave configuration of the metal bump 21 is accomplished easily by a method consisting of, for example, forming a metal bump on a printed circuit pattern (or on an electrode pad) using a bump bonder capillary and pressing the capillary onto the formed metal bump to indent the metal bump. Note that in FIG. 8, only characteristic elements are shown. Other parts, such as the printed circuit pattern 3, the electrode pad 5, etc., that are shown in FIG. 1, are omitted from the illustration.

Figure 9:
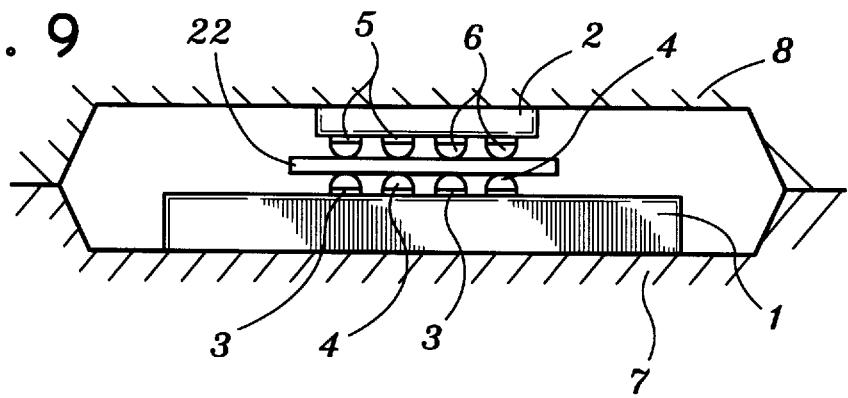
FIG. 9 is a side view depicting a use of an anisotropic conductive film according to the first embodiment of the present invention.

FIG. 9 shows an arrangement of an electrically conductive elastic body 22, such as an electrically conductive sheet or an electrically conductive gum, for example, which is located between the metal bumps 4,6 to increase the cold welding sandwich strength and provide a more effective connection.

The electrically conductive sheet can be an anisotropic conductive film (ACF), for example. ACFs have been used to connect a liquid crystal drive device with a printed circuit board. A typical ACF has a structure consisting of nickel particles coated by gilding (or plastic particles coated by nickel plating and further coated by gilding), with the gilded particles surrounded by an epoxy. Although an ACF is nonconductive in its normal state, it becomes conductive when pressed at pressures exceeding a threshold value. Only the portion of the ACF that is pressed at pressures exceeding the threshold value is conductive because only in that portion is the density of the conductive particles sufficiently high. Therefore, even if the ACF is used as shown in FIG. 9, all the metal bumps 4,6 do no become short circuited to each other.

The above-mentioned guide materials 19,20 (see FIGS. 5 and 6), the recess formed in the surface of sandwich material 8 (see FIG. 7), the metal bump 21 having a concave configuration (see FIG. 8), and the electrically conductive elastic body 22 (see FIG. 9), can be employed individually or in various combinations thereof.

Figure 10:
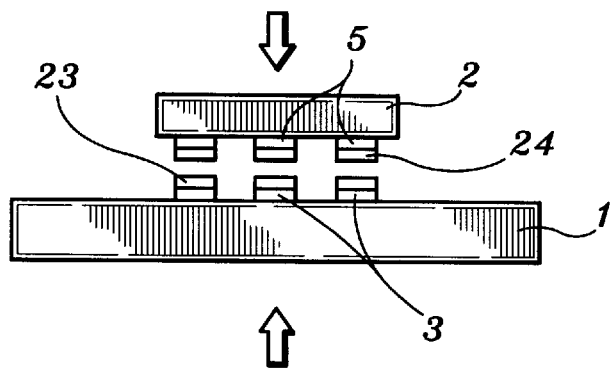
FIG. 10 is a side view of a second embodiment of the present invention.

FIG. 10 depicts a cross-sectional view of a connection structure according to a second embodiment of the present invention. According to the second embodiment, plating layers 23,24 are employed instead of the metal bumps 4,6 of the first embodiment. That is, a plating layer 23,24, such as gold or solder, for example, is formed on the printed circuited pattern 3 on the printed circuit board 1 and on the electrode pad 5 on the semiconductor device 2, as shown in FIG. 10, and the semiconductor device 2 is connected to the printed circuit board 1 by cold welding.

The second embodiment of the present invention provides a similar effect as that of the first embodiment described above. This embodiment has the plating layers 23,24 formed on each of the printed circuit pattern 3 and the electrode pad 5, and the plating layers 23,24 are used in connecting the electrode pad 5 with the printed circuit pattern 3, as shown in FIG. 10. However, an object of the present invention is accomplished if only one of the plating layers 23,24 is formed on the printed circuit pattern 3 or on the electrode pad 5.

Figure 11:
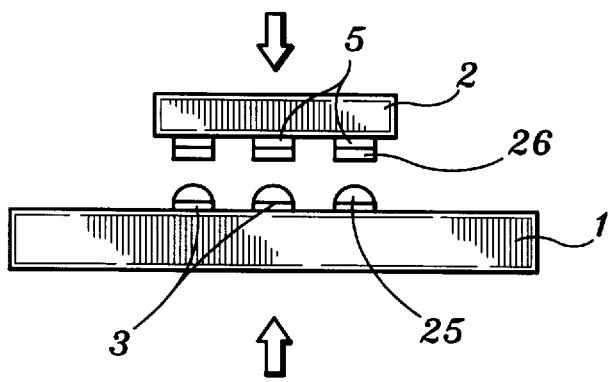
FIG. 11 is a side view of a third embodiment of the present invention.
Figure 12:
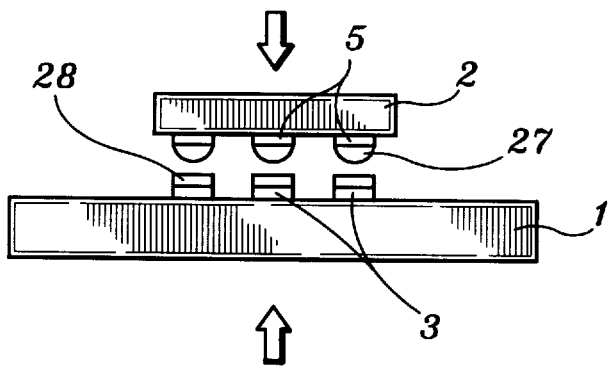
FIG. 12 is a side view of a fourth embodiment of the present invention.

FIGS. 11 and 12 depict cross-sectional views of connection structures according to third and fourth embodiments of the present invention, respectively. According to the embodiments as depicted in FIGS. 11 and 12, a metal bump 25,27 is formed on one of the printed circuit pattern 3 on the printed circuit board 1 or on the electrode pad 5 on the semiconductor device 2, and a plating layer 26,28 is formed on the other of the printed circuit pattern 3 or the electrode pad 5. The semiconductor device 2 is then connected with the printed circuit board 1 by cold welding.

In each of the above second, third, and fourth embodiments, cold welding can be accomplished by using the casings 7,8 in the same manner as described for the first embodiment. Similar to the first embodiment, whether the space formed between the casings 7,8 is produced intentionally or not is not important.

Compression bonding can also be applied together with cold welding, similar to the first embodiment. Also, methods of cold welding, compression bonding, and the separation procedures used for cold welded structures or compression bonded structures are similar to those described above for the first embodiment.

In the second, third, and fourth embodiments, the guide parts 19,20 can be formed at a portion of the sandwich material 8 at which the semiconductor device 2 is arranged, or they can be formed at a portion of the printed circuit board 1 onto which the semiconductor device 2 is to be arranged, and the recess can be formed at a portion of the sandwich material 8 at which the semiconductor device 2 is arranged, similar to the first embodiment.

Also similar to the first embodiment, an electrically conductive elastic body 22, such as an electrically conductive sheet, can be arranged between the printed circuit pattern 3 and the electrode pad 5 to effectuate a more reliable connection for the second, third, and fourth embodiments.

Furthermore, similar to the first embodiment, a guide part 19,20 on the sandwich material 8 or on the printed circuit board 1, a recess in the sandwich material 8, and an electrically conductive elastic body 22 can be used individually or in various combinations thereof in the second, third, and fourth embodiments.

The fourth embodiment shown in FIG. 12 is the most effective of the embodiments because, even though metal bumps require more manufacturing steps, forming a metal bump on the electrode pad of the semiconductor device is less risky than forming a plating layer on the electrode pad of the semiconductor device. The fourth embodiment is also more preferable because of an increased flexibility in positioning the semiconductor device with respect to the printed circuit board.

As described above, in the connection structure according to the present invention, both an electrical and a mechanical connection between the electrode pad on the semiconductor device and the printed circuit pattern on the printed circuit board is accomplished by forming a metal bump or a plating layer on the printed circuit pattern on the printed circuit board and/or on the electrode pad on the semiconductor device using cold welding or compression bonding or a combination of both in conjunction with sandwich materials. The semiconductor device can be separated from the printed circuit board without destroying the semiconductor device or the printed circuit board. Therefore, it is easily possible to remove the semiconductor device from the printed circuit board to make necessary repairs and/or exchange parts, and then to reconnect the semiconductor device with the printed circuit board.

In addition, the present invention makes the connection process easier and has a lower manufacturing cost compared with using conventional methods such as reflow methods.

In the connection structure according to the present invention, the mounted body of the printed circuit board and the semiconductor device is sandwiched by sandwich materials such as casings, and the sandwich materials can also serve as boards for efficiently radiating heat from the structure.

The embodiments described above are illustrative examples of the present invention and it should not be construed that the present invention is limited to these particular embodiments. Various changes and modifications may be effected by one skilled in the art without departing from the spirit or scope of the invention as defined in the appended claims.

What is claimed is:

1. A connection structure for connecting a semiconductor device and a printed circuit board, in which an electrode pad on the semiconductor device is connected with a printed circuit pattern on the printed circuit board, the connection structure comprising:

a metal bump or a plating layer formed on at least one of an electrode pad and a printed circuit pattern, the electrode pad and the printed circuit pattern being arranged opposite each other and separated from each other by the metal bump or the plating layer, wherein the electrode pad, the metal bump or the plating layer, and the printed circuit board form a mounting Structure; and sandwich materials having a top portion and a bottom portion for receiving and pressing the mounting structure therebetween to form a mounted body of the semiconductor device connected to the printed circuit board through the metal bump or the plating layers wherein said sandwich materials are casings which form part of an electrical apparatus in which the mounted body is included and hold the mounted body therein during use.

2. A connection structure according to claim 1, wherein the sandwich materials are casings that are part of an electrical apparatus in which the mounted body is included.

3. A connection structure according to claim 1, further comprising an electrically conductive adhesive, wherein the electrode pad and the printed circuit pattern are connected through the electrically conductive adhesive.

4. A connection structure according to claim 1, wherein a guide portion is formed on at least one of the sandwich materials and the printed circuit board, the guide portion being used for positioning the semiconductor device relative to the printed circuit board.

5. A connection structure according to claim 1, wherein the sandwich materials include a recess for positioning the semiconductor device relative to the printed circuit board.

6. A connection structure according to claim 1, further comprising an electrically conductive elastic body, wherein the electrode pad and the printed circuit pattern are connected through the electrically conductive elastic body.

7. A connection structure according to claim 6, wherein the electrically conductive elastic body is an anisotropic conductive film.

8. A connection structure for connecting a semiconductor device and a printed circuit board, in which an electrode pad on the semiconductor device is connected with a printed circuit pattern on the printed circuit board, the connection structure comprising:

a first metal bump formed on an electrode pad;

a second metal bump formed on a printed circuit pattern, the electrode pad and the printed circuit pattern being arranged opposite each other and separated from each other by the first and second metal bumps, the electrode pad, the first and second metal bumps, and the printed circuit board forming a mounting structure; and sandwich materials having a top portion and a bottom portion for receiving and pressing the mounting structure therebetween to form a mounted body of the semiconductor device connected to the printed circuit board through the first and second metal bumps, wherein said sandwich materials are casinos which form part of an electrical apparatus in which the mounted body is included and hold the mounted body therein during use, wherein one of the first and the second metal bumps has a concave shape and the other of the first and the second first metal bumps has a convex shape.

9. A connection structure for connecting a semiconductor device and a printed circuit board, in which an electrode pad on the semiconductor device is connected with a printed circuit pattern on the printed circuit board, the connection structure comprising:

a metal bump formed on an electrode pad;

a plating layer formed on a printed circuit pattern; and sandwich materials, wherein the electrode pad and the printed circuit pattern are arranged opposite each other and are separated from each other through the metal bump and the plating layer to form a mounting structure, and the semiconductor device and the printed circuit board are sandwiched by the sandwich materials and pressed together by the sandwich materials to form a mounted body of the semiconductor device connected to the printed circuit board through the metal bump and the plating layer, wherein said sandwich materials are casings which from part of an electrical apparatus in which the mounted body is included and hold the mounted body therein during use.

10. A connection structure according to claim 9, wherein the sandwich materials are casings that are part of an electrical apparatus in which the mounted body is included.

11. A connection structure according to claim 9, further comprising an electrically conductive adhesive, wherein the electrode pad and the printed circuit pattern are connected through the electrically conductive adhesive.

12. A connection structure according to claim 9, wherein a guide portion is formed on at least one of the sandwich materials and the printed circuit board, the guide portion being used for positioning the semiconductor device relative to the printed circuit board.

13. A connection structure according to claim 9, wherein the sandwich materials include a recess for positioning the semiconductor device relative to the printed circuit board.

14. A connection structure according to claim 9, further comprising an electrically conductive elastic body, wherein the electrode pad and the printed circuit pattern are connected through the electrically conductive elastic body.

15. A connection structure according to claim 14, wherein the electrically conductive elastic body is an anisotropic conductive film.

* * * * *

UNITED STATES PATENT AND TRADEMARK OFFICE
CERTIFICATE OF CORRECTION

PATENT NO. : 5,883,432
DATED      : March 16, 1999
INVENTOR(S): Masahiro HIGASHIGUCHI It is certified that error appears in the above-indentified patent and that said Letters Patent is hereby corrected as shown below:

On the title page, please add item --[30] Foreign Application
       Priority Data
    Nov. 30, 1995   [JP]    Japan............7-335795--

Signed and Sealed this

Twenty-eighth Day of September, 1999

Attest:

Q. TODD DICKINSON

*Attesting Officer*    *Acting Commissioner of Patents and Trademarks*